United States Patent [19]

Fukushi et al.

[11] Patent Number: 4,745,582

[45] Date of Patent: May 17, 1988

[54] BIPOLAR-TRANSISTOR TYPE RANDOM ACCESS MEMORY DEVICE HAVING REDUNDANCY CONFIGURATION

[75] Inventors: Isao Fukushi, Tokyo; Tomoharu Awaya, Yokohama, both of Japan

[73] Assignee: Fujitsu Limited, Kawasaki, Japan

[21] Appl. No.: 788,458

[22] Filed: Oct. 17, 1985

[30] Foreign Application Priority Data

Oct. 19, 1984 [JP] Japan ............................. 59-218707
Nov. 14, 1984 [JP] Japan ............................. 59-238580

[51] Int. Cl.⁴ .................................................. G11C 13/00
[52] U.S. Cl. ........................................ 365/200; 365/189
[58] Field of Search ............................ 365/200, 189, 230

[56] References Cited

U.S. PATENT DOCUMENTS 4,462,091  7/1984  Knepper et al. ................... 365/200
4,523,313  6/1985  Nibby, Jr. et al. ................. 365/200
4,577,294  3/1986  Brown et al. ....................... 365/200

Primary Examiner—Terrell W. Fears
Attorney, Agent, or Firm—Staas & Halsey

[57] ABSTRACT

A bipolar-transistor type RAM device, particularly an ECL type RAM device, includes a memory cell array, an address receiving circuit, a normal memory cell selecting circuit, and a redundancy configuration. The redundancy configuration includes a redundancy memory cell array, a defective memory address storing circuit, an address comparing circuit, and a redundancy memory cell selecting circuit. The address comparing circuit directly receives the address signal and the defective memory address signal. The normal memory cell selecting circuit is energized when the address signal does not equal the defective memory address signal. Otherwise, the redundancy memory cell selecting circuit is energized.

3 Claims, 6 Drawing Sheets

| Fig. 2A | Fig. 2B |

BIPOLAR-TRANSISTOR TYPE RANDOM ACCESS MEMORY DEVICE HAVING REDUNDANCY CONFIGURATION

BACKGROUND OF THE INVENTION

1. Field of the Invention

The present invention relates to a bipolar-transistor type random access memory (RAM) device having a redundancy configuration. More particularly, the present invention relates to an emitter-coupled-logic (ECL) type RAM device having a redundancy configuration.

2. Description of the Related Art

In a RAM device, a large number of memory cells are arranged along rows and columns. The density of defects generated in such a semiconductor memory device during the manufacture thereof is relatively independent of the integration density of the device. Rather, the density of defects is derived from the semiconductor manufacturing technology. In general, the higher the integration density of the device, the greater the ratio of normal memory cells to defective memory cells. This is one of the advantages of increasing the integration density of a semiconductor memory device. Even if a device includes only one defective memory cell, however, the device cannot be operated normally, and therefore, must be scrapped. As a result, despite the lower ratio of defective memory cells, the greater the integration density the lower the manufacturing yield.

In a metal-insulator-semiconductor (MIS) type RAM, in order to overcome the problem of defective memory cells, use is made of redundancy memory cells. When a defective memory cell is detected, a redundancy memory cell row or column is selected instead of the memory cell row or column including the defective memory cell. In general, one or two redundancy memory cell rows or columns are usually provided.

In the prior art, however, no bipolar-transistor type RAMs have a redundancy configuration because there has been no redundancy configuration suitable for a bipolar-transistor type RAM. The reason is that bipolar-transistor type RAMs operates at a much higher speed than a MIS type RAM. Also, there has not been any strong demand for a redundancy configuration in a bipolar-transistor type RAM due to the comparatively small number of memory cells therein.

With improvements in integration technology for bipolar-transistor type RAMs and the requirement for larger number of memory cells, bipolar-transistor type RAM devices having a large number of memory cells have come into demand. Accordingly, bipolar-transistor type RAMs having a redundancy configuration have also come into demand.

SUMMARY OF THE INVENTION

It is, therefore, an object of the present invention to provide a bipolar-transistor RAM device having a redundancy configuration.

It is another object of the present invention to provide a redundancy configuration for a bipolar-transistor RAM device having the same operation time as the bipolar-transistor RAM device.

It is still another object of the present invention to provide a redundancy configuration for a bipolar-transistor RAM device with a simple circuit configuration.

It is yet another object of the present invention to provide a redundancy configuration suitable for an ECL type RAM device.

According to the present invention, there is provided a bipolar-transistor type RAM device including a memory cell array having a plurality of memory cells. A circuit for receiving an address signal, and a circuit, operatively connected to the address receiving circuit, for selecting a normal memory cell in the memory cell array in response to the address signal from the address receiving circuit are also provided. The RAM device further includes a redundancy memory cell array having a plurality of memory cells, a circuit for storing one or more defective memory addresses of one or more defective memory cells in the memory cell array, and a circuit, operatively connected to the defective address storing circuit, for receiving the address signal independently of the address receiving circuit and one or more defective memory address signals from the defective address storing circuit and for comparing the address signal with the defective memory address signal. A circuit is also provided which is operatively connected to the address receiving and comparing circuit, for selecting a memory cell in the redundancy memory cell array corresponding to a defective memory cell in the memory cell array. A normal memory cell selecting circuit, which is operatively connected to the address receiving and comparing circuit, is energized when the address signal does not equal the defective memory address signal. Otherwise, the redundancy memory cell selecting circuit is energized.

Preferably, the address receiving and comparing circuit and the redundancy memory cell selecting circuit may include a plurality of steps of circuits equal to the plurality of steps of circuits formed in the address receiving circuit and the normal memory cell selecting circuit so that the operation time of the address receiving and comparing circuit and the redundancy memory cell selecting circuit is equal to the operation time of the address receiving circuit and the normal memory cell selecting circuit.

According to the present invention, there is also provided an ECL type RAM device, of the same structure as the bipolar-transistor type RAM device set forth above. This is a preferred application of the bipolar-transistor type RAM device.

BRIEF DESCRIPTION OF THE DRAWINGS

Other objects and features of the present invention will be described below in detail with reference to the accompanying drawings, in which.

DESCRIPTION OF THE PREFERRED EMBODIMENTS

Figure 1:
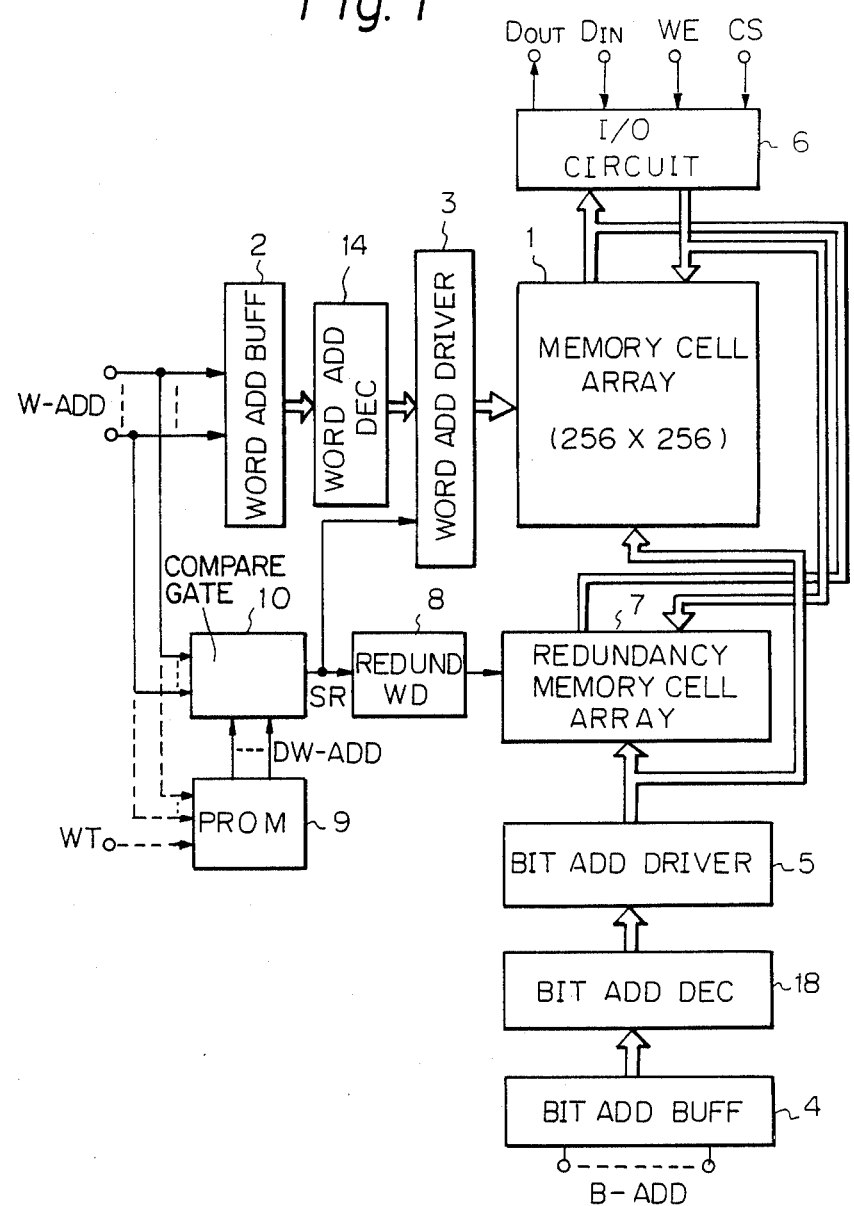
FIG. 1 is a circuit diagram of an embodiment of a bipolar-transistor type RAM device having a redundancy configuration in accordance with the present invention.

Referring to FIG. 1, a bipolar-type RAM device includes a normal configuration and a redundancy configuration. The normal configuration includes a memory cell array 1 having a plurality of memory cells in a matrix form with a plurality of word lines, e.g., 256 word lines in this embodiment, and a plurality of bit lines, e.g., 256 bit lines. Accordingly, the capacity of the memory cell array 1 is, for example, $256 \times 256$ bits, i.e., 64K bits. The normal configuration includes a word address buffer 2 receiving a word address signal W-ADD consisting of $A_0$ to $A_7$ bits, a word address decoder 14, and a word address driver 3 which selectively drives the word lines in response to the word address signal W-ADD. The normal configuration also includes a bit address buffer 4 receiving a bit address signal B-ADD consisting of $A_8$ to $A_{15}$ bits, a bit address decoder 18, and a bit address driver 5 selectively driving the bit lines in response to the bit address signal B-ADD. The normal construction further includes an input and output (I/O) circuit 6 having 256 sense amplifiers, 256 write amplifiers, and a control circuit thereof. In the circuit set forth above, the word address decoder 14 and the word address driver 3 may be constructed as one circuit unit. Similarly, the bit address decoder 18 and the bit address driver 5 may be constructed as one circuit unit. The redundancy configuration includes a redundancy memory cell array 7 having a plurality of redundancy memory cells in the form of a redundancy word line and 256 redundancy bit lines. The redundancy configuration also includes a compare gate circuit 10 which receives the word address signal W-ADD and a defective word address signal DW-ADD from a programable read-only memory (PROM) 9, the PROM 9 stores the defective word address signal DW-ADD, and a redundancy word address driver 8 drives the redundancy word line in the redundancy memory cell array 7.

In FIG. 1, each memory cell circuit in the redundancy memory cell array 7 is identical to a memory cell circuit in the memory cell array 1, resulting in the same operation time. The signal processing speed from the compare gate circuit 10 to the redundancy word address driver 8 is approximately the same as that from the word address buffer 2 to the word address driver 3. The bit address driver 5 drives both bit lines in the memory cell array 1 and the redundancy memory cell array 7 concurrently. The I/O circuit 6 communicates with both the memory cell array 1 and the redundancy memory cell array 7 for reading-out or storing the data from or into either one of the memory cell array 1 and the redundancy memory cell array 7.

If a defective memory cell is detected in the memory cell array 1 during an operation test of a semifinished bipolar-transistor type RAM device, such as in a wafer state, a word address signal W-ADD corresponding to the defective memory cell is stored in the PROM 9 in response to the application of a write signal WT for the PROM 9 as shown by the dotted lines.

The operation of the bipolar-transistor type RAM device shown in FIG. 1 will now be described.

When a write enable signal WE which is a high level, designating a write mode, is applied to the I/O circuit 6, the word address signal W-ADD is supplied to the word address buffer 2 and the compare gate circuit 10. The compare gate circuit 10 compares the word address signal W-ADD with the defective word address signal DW-ADD from the PROM 9 and outputs either a high level redundancy circuit selection signal SR when the address signals W-ADD and DW-ADD are identical or a low level redundancy circuit selection signal SR. If a low level redundancy circuit selection signal SR is output, the word address decoder 14 and the word address driver 3 are energized. Accordingly, a signal of the word address signal W-ADD, which is amplified and shifted to a predetermined level at the word address buffer 2, is decoded at the word address decoder 14 to generate a word line selection signal applied to the word address decoder 14, resulting in the selection of the word line in the memory cell array 1 corresponding to the word address signal W-ADD from the word address driver 3. At the same time, the bit address signal B-ADD is supplied to the bit address buffer 4 in response to the application of a chip enable signal CS to the I/O circuit 6 which amplifies and shifts it to a predetermined signal level. A signal output from the bit address buffer 4 is decoded at the bit address decoder 18 to generate a bit line selection signal applied to the bit address driver 5, resulting in the selection of the bit lines in the memory cell array 1 corresponding to the bit address signal B-ADD. As a result, an input data $D_{IN}$ supplied to the I/O circuit 6 is stored in the memory cells in the memory cell array 1, which are designated by the selected word line and the selected bit lines.

In contrast, if a high level redundancy circuit selection signal SR is output from the compare gate circuit 10, the redundancy word address driver 8 is energized instead of the word address decoder 14 and the word address driver 3 for the memory cell array 1. The redundancy word driver 8 activates the redundancy word line in the redundancy memory cell array 7. The selection of the bit lines in the redundancy memory cell array 7 is similar to that of the memory cell array 1 mentioned above. As a result, the input data $D_{IN}$ to the I/O circuit 6 is stored in the redundancy memory cells in the redundancy memory cell array 7 which are designated by the selected bit lines.

The read-out operation from the memory cell array 1 or the redundancy memory cell array 7 is effective similar to the above operation, when the write enable signal WE is a low level.

In order to keep the high speed operation time of the redundancy configuration the same as the operation time of the normal configuration, the following design redundancy considerations have been made: (a) the word address signal W-ADD is directly supplied to the compare gate circuit 10 in the redundancy configuration without passing through the word address buffer 2, as in a MIS type RAM device; (b) the signal propagation time from the compare gate circuit 10 to the redundancy word address driver 8 is made the same as that from the word address buffer 2 to the word address driver 3 or the number of circuit steps in the compare gate circuit 10 and the redundancy word address driver 8 are made the same as in the word address buffer 2, the word address decoder 14, and the word address driver 3 (c) each memory cell circuit in the redundancy memory cell array 7 is made the same as that of the memory cell in the memory cell array 1, and (d) the bit lines or the address lines in the redundancy memory cell array 7 are driven simultaneously with those in the memory cell array 1.

The redundancy configuration shown in FIG. 1 is only for one defective memory cell in each bit line. In order to provide a plurality of defective memory cells of a bit line in the memory cell array 1, a plurality of redundancy configurations, each of which includes a compare gate circuit 10, redundancy word address driver 8, PROM 9 and redundancy memory cell array 7, are required. This circuit configuration may be applied to the word lines instead of the bit lines.

Figures 2, 2A:
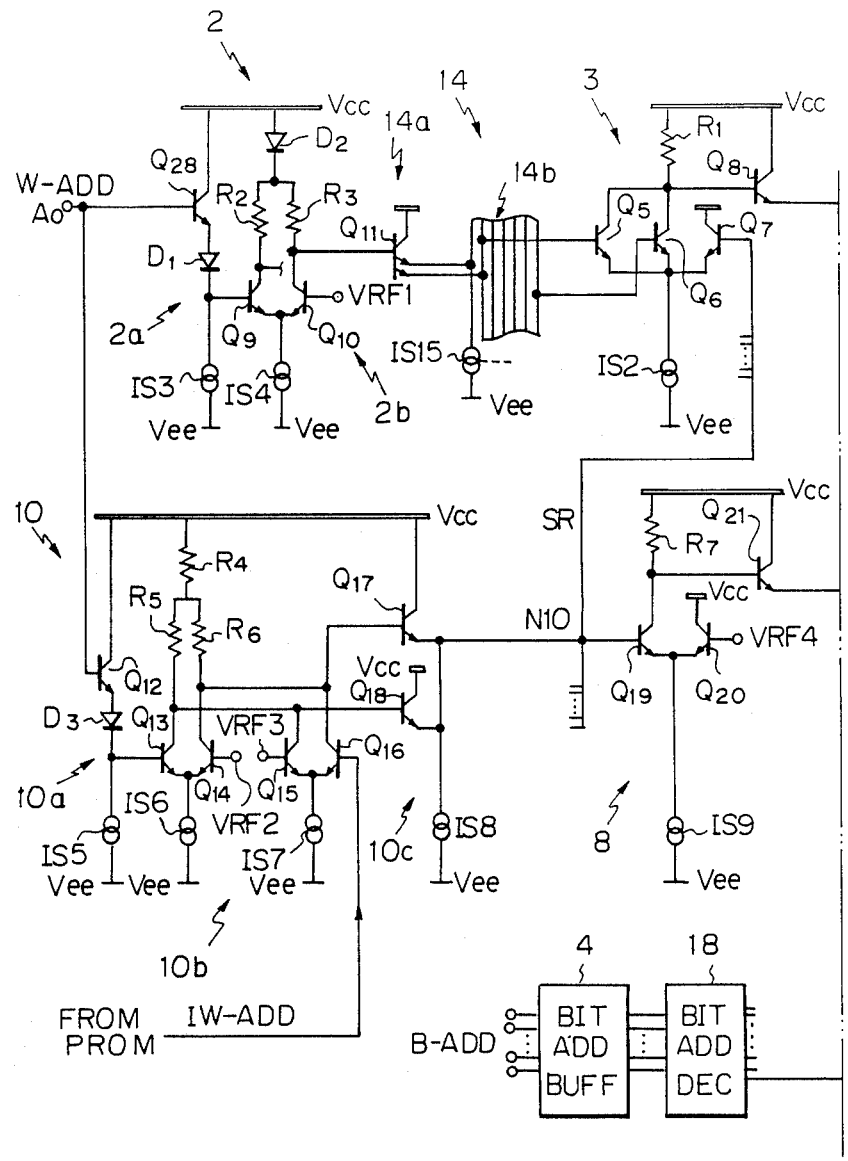
FIG. 2 (including FIGS. 2A and 2B) is a circuit diagram of the RAM device shown in FIG. 1, for a first embodiment of an ECL type RAM device.
Figure 2B:
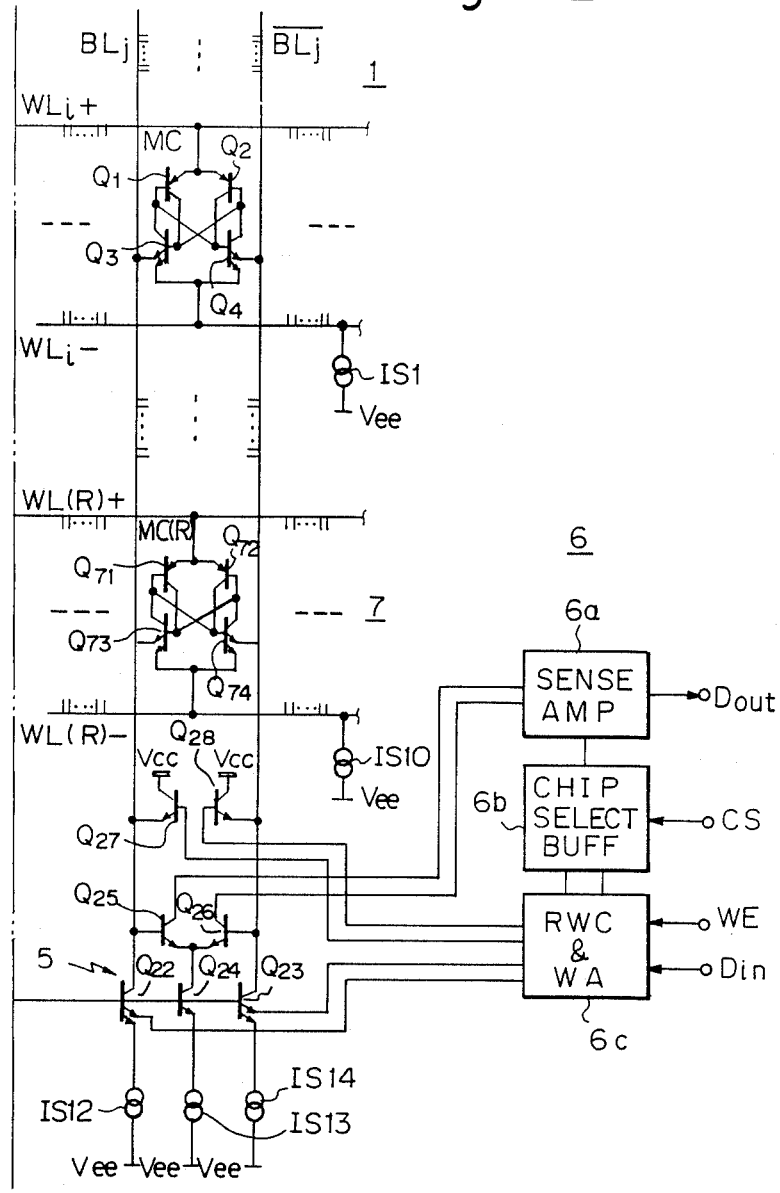

Referring to FIG. 2, which includes FIGS. 2A and 2B, a specific circuit of an ECL type RAM device, for example, the bipolar-transistor type RAM device shown in FIG. 1, will be described.

In FIG. 2, the memory cell array 1 includes a plurality of memory cells MC, only one of which is shown for simplifying the drawing. The memory cell MC is connected between a high-voltage word line $WL_i+$ and a low-voltage word line (or a holding line) $WL_i-$ and between a bit line $BL_j$ and an inverted bit line $\overline{BL_j}$, and forms a flip-flop circuit including pnp type transistors $Q_1$ and $Q_2$ and npn type multi-emitter transistors $Q_3$ and $Q_4$. A constant current source $IS_1$ is provided between the low-voltage word line $WL_i-$ and a low-voltage power supply terminal $V_{ee}$. The word address driver 3 includes a current switch circuit having npn type transistors $Q_5$, $Q_6$, and $Q_7$, having emitters which are commonly connected. Transistors $Q_5$ and $Q_6$ also have commonly connected collectors. A constant current source $IS_2$ is connected between the commonly connected emitters and the low-voltage power supply terminal $V_{ee}$. A resistor $R_1$ is connected between a high-voltage power supply terminal $V_{cc}$ and a commonly connected collectors of the transistors $Q_5$ and $Q_6$. An npn type transistor $Q_8$ drives the high-voltage word line $WL_i+$. The word address buffer 2 receives a bit $A_0$ of the word address signal W-ADD. The word address buffer 2 includes an emitter follower (or a level shift circuit) 2a and a current switch circuit 2b. The emitter follower 2a includes a npn type transistor $Q_{28}$ receiving the bit $A_0$ at a base thereof, a diode $D_1$, and a constant current source $IS_3$, series-connected between the high and low-voltage power supply terminals $V_{cc}$ and $V_{ee}$. The current switch circuit 2b includes a diode $D_2$, a resistor $R_2$, an npn type transistor $Q_9$, and a constant current source $IS_4$. The current switch circuit 2b also includes a series circuit of a resistor $R_3$ and an npn type transistor $Q_{10}$, which is connected in parallel to a series circuit of the resistor $R_2$ and the transistor $Q_9$. A base of the transistor $Q_9$ is connected to a common-connected point of the diode $D_1$ and the constant current source $IS_3$. A base of the transistor $Q_{10}$ is supplied with a reference voltage $VRF_1$. The word address decoder 14 includes a decoding circuit 14b having a plurality of signal lines, a plurality of constant current sources, each connected to a corresponding signal line of the decoding circuit 14b, and constant current sources $IS_{15}$ (only one current source is shown for simplicity). The word address decoder 14 also includes a circuit 14a having an npn type multi-emitter transistor $Q_{11}$ for selecting the signal lines of the decoding circuit 14b. A base of the transistor $Q_{11}$ is connected to a collector of the transistor $Q_{10}$ in the current switch circuit 2b. The circuit 14a includes another npn type multi-emitter transistor (not shown) between a collector of the transistor $Q_9$ and the decoding circuit 14b, similar to the transistor $Q_{11}$. The line connection between the emitters of the transistors in the circuit 14a and the signal lines in the decoding circuit 14B, and between the signal lines in the decoding circuit 14b and the bases of the transistors $Q_5$ and $Q_6$ in the word address driver 3, defines the selection of the word line WL.

The bit address driver 5, represented in the drawing by a single circuit for driving a pair of bit lines $BL_j$ and $\overline{BL_j}$ for simplifying the drawing, includes npn type multi-emitter transistors $Q_{22}$ and $Q_{23}$, an npn type transistor $Q_{24}$, and constant current sources $IS_{12}$, $IS_{13}$, and $IS_{14}$, each connected between respective emitters of the above transistors and the low-voltage power supply terminal $V_{ee}$. The bit address driver 5 also includes a pair of transistors $Q_{25}$ and $Q_{26}$ and a pair of transistors $Q_{27}$ and $Q_{28}$. The I/O circuit 6 includes a sense amplifier circuit 6a, a chip select buffer 6b, and a read-write control and write amplifier circuit 6c. The sense amplifier circuit 6a is connected to collectors of the transistors $Q_{25}$ and $Q_{26}$, reading out voltage between the bit lines $BL_j$ and $\overline{BL_j}$ as read-out data $D_{OUT}$. The read-write control and write amplifier circuit 6c, specifically the write amplifier (not shown), is connected to the bases of the transistors $Q_{27}$ and $Q_{28}$, storing input data $D_{IN}$ a desired memory cell MC. The read-write control and write amplifier circuit 6c controls the above read-out and storing operation in response to a write enable signal WE. The chip select buffer 6b triggers the sense amplifier circuit 6a and the read-write control and write amplifier circuit 6c in response to a chip select signal CS. Detailed circuits of the bit address buffer 4 and the bit address decoder 18 are similar to those of the word address buffer 2 and the word address decoder 14 and, thus, are not explained.

The compare gate circuit 10, represented in the drawing by a single circuit for the $A_0$ bit of the word address information W-ADD for simplifying the drawing, includes an emitter follower 10a, a compare circuit 10b, and an OR gate output circuit 10c. The circuits 10b and 10c form an exclusive OR (EOR) circuit. The emitter follower 10a includes an npn type transistor $Q_{12}$ receiving the $A_0$ bit of the word address signal W-ADD at a base thereof, a diode $D_3$, and a constant current source $IS_5$, series-connected between the high and low-voltage power supply terminals $V_{cc}$ and $V_{ee}$. The compare circuit 10b includes resistors $R_4$, $R_5$ and $R_6$, npn type transistors $Q_{13}$, $Q_{14}$, $Q_{15}$ and $Q_{16}$, and constant current sources $IS_6$ and $IS_7$. A base of the transistor $Q_{13}$ is connected to an emitter of the transistor $Q_{12}$ through the diode $D_3$. Bases of the transistors $Q_{14}$ and $Q_{15}$ are supplied with reference voltages $VRF_2$ and $VRF_3$, which may be the same voltage. A base of the transistor $Q_{16}$ is supplied with an $A_0$ bit of the defective word address information DW-ADD from the PROM 9 shown in FIG. 1, when the corresponding defective memory cell address is stored in the PROM 9. The output circuit 10c includes npn type transistors $Q_{17}$ and $Q_{18}$, functioning as an OR gate, and a constant current source $IS_8$. At a node $N_{10}$ connected to a base of the transistor $Q_7$ and to a base of a transistor $Q_{19}$, described later, an output of the output circuit 10c, commonly connected to the emitters of the transistors $Q_{17}$ and $Q_{18}$, is commonly connected to other outputs from other output circuits in other compare circuits (not shown) in the compare gate circuit 10 for $A_1$ to $A_7$ bits of the word address signal W-ADD, supplying a redundancy circuit selection signal SR to the transistors $Q_7$ and $Q_{19}$.

The redundancy word driver 8 includes npn type transistors $Q_{19}$ and $Q_{20}$, forming a differential circuit, a constant current source $IS_9$, a resistor $R_7$, and an npn type transistor $Q_{21}$ driving a redundancy high-voltage word line WL(R)+ in the redundancy memory cell array 7.

A redundancy memory cell MC(R), including pnp type transistors $Q_{71}$ and $Q_{72}$ and npn type multi-emitter transistors $Q_{73}$ and $Q_{74}$ forming a flip-flop, is provided between the high-voltage word line WL(R)+ and a redundancy low-voltage word line WL(R)— connected to a constant current source $IS_{10}$ discharging current onto the high and low voltage word lines, and between the high and low-voltage bit lines $BL_j$ and $\overline{BL}_j$. The circuit of the redundancy memory cell MC(R) is identical to that of the memory cell MC in the memory cell array 1. One pair of redundancy word lines WL(R)+ and WL(R)— are provided in the redundancy memory cell array 7. A plurality of pairs of bit lines BL and $\overline{BL}$ are commonly provided in the memory cell array 1 and the redundancy memory cell array 7.

Figure 3:
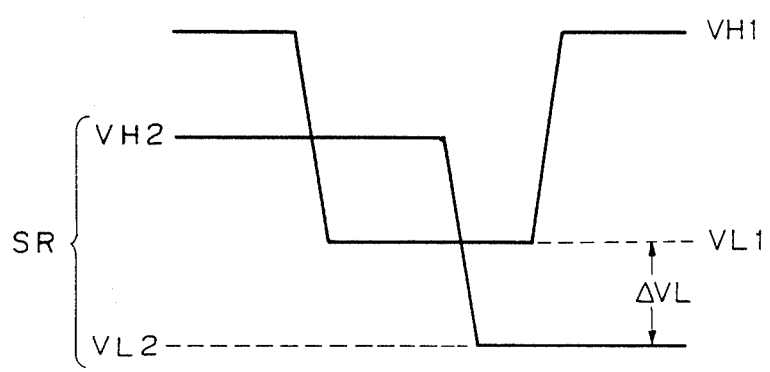
FIG. 3 is a waveform diagram of the signal characteristics for explaining the operation and functions of the circuit shown in FIG. 2.

The operation of the compare gate circuit 10 will be described with reference to FIG. 3. The compare gate circuit 10 includes the EOR circuit of the compare circuit 10b and the OR gate output circuit 10c. The EOR circuit outputs a lowest voltage $VL_2$ of the redundancy circuit selection signal SR when the word address signal W-ADD matches the defective word address signal DW-ADD from the PROM 9 and outputs the voltage $VH_2$ of the selection signal SR otherwise.

When the $A_0$ bit of the word address signal W-ADD is high level, the transistor $Q_{12}$ is turned ON, resulting in the transistor $Q_{13}$ being turned ON, and thus, the transistor $Q_{14}$ is OFF. When the $A_0$ bit of the defective word address signal DW-ADD from the PROM 9 is also high level, the transistor $Q_{16}$ is turned ON, and thus, the transistor $Q_{15}$ is turned OFF. The bases of the transistors $Q_{17}$ and $Q_{18}$ are supplied with low level voltage, maintaining the transistors $Q_{17}$ and $Q_{18}$ OFF. As a result, the output of the OR gate output circuit 10c is low level. On the other hand, when the $A_0$ bit of the word address signal W-ADD is high and the $A_0$ bit of the defective word address signal DW-ADD is low, the transistor $Q_{16}$ is turned OFF and the transistor $Q_{15}$ is turned ON, resulting in the transistor $Q_{18}$ being OFF. The transistor $Q_{14}$ is turned OFF, resulting in the transistor $Q_{17}$ being ON and rendering the redundancy circuit selection signal SR the high level $VH_2$. In addition, when the $A_0$ bit of the word address signal W-ADD is low and the $A_0$ bit of the defective word address signal DW-ADD is high, opposite to the above, the transistor $Q_{17}$ is turned ON and the transistor $Q_{18}$ is turned OFF, resulting in a high level $VH_2$ of the redundancy circuit selection signal SR. Furthermore, when both the $A_0$ bits of the word address signal W-ADD and the defective word address signal DW-ADD are low level, the transistor $Q_{13}$ is turned OFF, the transistor $Q_{14}$ is turned ON, the transistor $Q_{15}$ is turned ON, and the transistor $Q_{16}$ is turned OFF. Thus, the transistors $Q_{17}$ and $Q_{18}$ are turned OFF, resulting in a low level redundancy circuit selection signal SR.

The above operation can be applied to the operation for other bits $A_1$ to $A_7$ of the word address signal W-ADD and other bits $A_1$ and $A_7$ of the defective word address signal DW-ADD. Accordingly, when all bits of the word address signal W-ADD are identical to those of the defective word address signal DW-ADD, the redundancy circuit selection signal SR at the node $N_{10}$ becomes the lowest level $VL_2$.

The resistor $R_4$ shifts the low level of the redundancy circuit selection signal SR from the normal low level $VL_1$ in the device to the lowest level $VL_2$ by a voltage $\Delta VL$. The level shift is of significance for the word line selection mentioned later.

The operation of the ECL type RAM device shown in FIG. 2 will be described. The word address signal W-ADD, the bit address signal B-ADD, the chip select signal CS having the high level, and the write enable signal WE having the low level indicating a read-out operation, are supplied to the RAM device. When the word address signal W-ADD does not match any defective word address signals DW-ADD, the current switch circuits 2b in the word address buffer 2 are operated in response to $A_0$ to $A_7$ bits of the word address signal W-ADD to energize the word address decoder 14. The base of the transistor $Q_7$ in the word address driver 3 is supplied with the high level $VH_2$ of the redundancy circuit selection signal SR, which is between the high level voltage $VH_1$ and low level voltage $VL_1$. When the voltage applied to the bases of the transistors $Q_5$ and $Q_6$ in the word address driver 3 is low due to the decoding in the word address decoder 14, the transistor $Q_8$ in the word address driver 3 is turned ON, driving the high-voltage word line $WL_i+$. At the same time, a bit line selecting signal from the bit address decoder 18, corresponding to the bit address signal B-ADD applied to the bit address buffer 4, is supplied to bases of the transistors $Q_{22}$ to $Q_{24}$ in the bit address driver 5, turning these transistors ON, and thus driving the bit lines $BL_j$ and $\overline{BL}_j$. The voltage on the bit lines $BL_j$ and $\overline{BL}_j$ is responsive to data stored in the memory cell MC in the memory cell array 1 and is transferred to the compare transistors $Q_{25}$ and $Q_{26}$ to read out the data $D_{OUT}$ through the sense amplifier circuit 6a. Upon reading out the data the chip select signal CS and the write enable signal WE are restored. During the above operaion, the redundancy circuit selection signal SR having the high level $VH_2$ is supplied to the base of the transistor $Q_{19}$ in the redundancy word driver 8, resulting in the transistor $Q_{19}$ being ON. The transistor $Q_{21}$ is OFF, therefore, the redundancy high-voltage word line WL(R)+ is de-energized.

When the write enable signal WE is a high level, designating the store operation, the transistors $Q_{27}$ and $Q_{28}$ are turned ON or OFF in response to the input data $D_{IN}$ to render the bit lines $BL_j$ and $\overline{BL}_j$ a high or low level, and thus, storing the input data $D_{IN}$ in the desired memory cells in the memory cell array 1.

When the word address signal W-ADD matches the defective word address signal DW-ADD, the redundancy circuit selection signal SR having the low level $VL_2$, which is lower than the normal low level $VL_1$, is supplied to the bases of the transistors $Q_7$ and $Q_{19}$. The transistor $Q_7$ is turned OFF, and thus, the transistor $Q_5$ or $Q_6$ is turned ON, deenergizing the high-voltage word line $WL_i+$. On the other hand, the transistor $Q_{19}$ in the redundancy word driver 8 is turned OFF and the transistor $Q_{20}$ is turned ON. The value of the reference voltage $VRF_4$ applied to the base of the transistor $Q_{20}$ is between the high level $VH_2$ and the low level $VL_2$ of the redundancy circuit selection signal SR. The transistor $Q_{21}$ in the redundancy word address driver 8 is turned ON, energizing the redundancy word line WL(R)+, and thus effecting the read-out or store operation to the redundancy memory cells MC(R) in the redundancy memory cell array 7.

The bit $A_0$ of the word address signal W-ADD is transferred to the emitter follower 2a, the current switch circuit 2b, the circuit 14a including the transistor $Q_{11}$, the word address driver circuit 3, and the transistor $Q_8$, i.e., a total five stage circuits, to the word line $WL_i+$. Similarly, the bit $A_0$ of the word address signal W-ADD is transferred to the emitter follower 10a, the compare circuit 10b, the OR gate output circuit 10c, the circuit including transistors $Q_{19}$ and $Q_{20}$, and the transistor $Q_{21}$, i.e., also a total five stage circuits, to the redundancy word line $WL(R)+$. Consequently, the selection time of the redundancy word line $WL(R)+$ is comparable with the selection time of the word line $WL_i+$. In the ECL type RAM device, which must have a high speed operation even when accessing the redundancy memory cell array 7, this is of great significance.

Figure 4A:
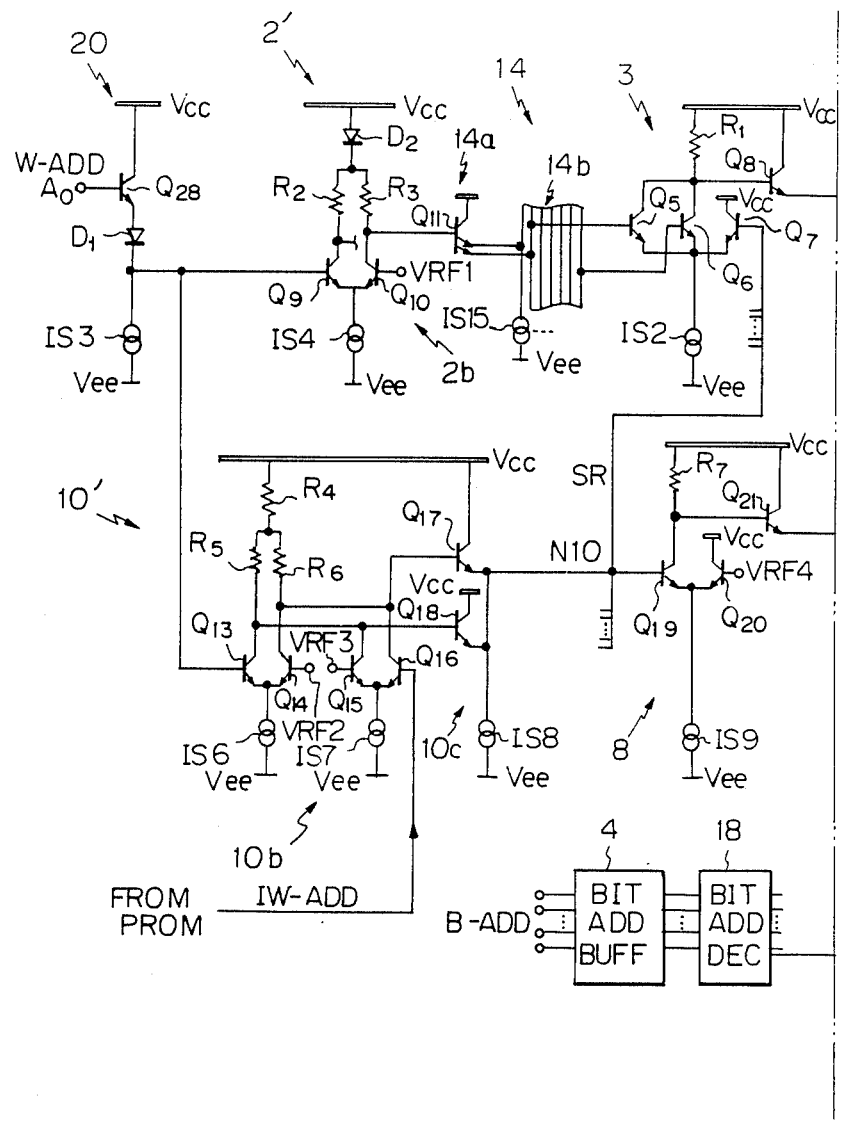
FIG. 4 (including FIGS. 4A and 4B) is another circuit diagram of the RAM device shown in FIG. 1 for another embodiment of an ECL type RAM device.
Figure 4B:
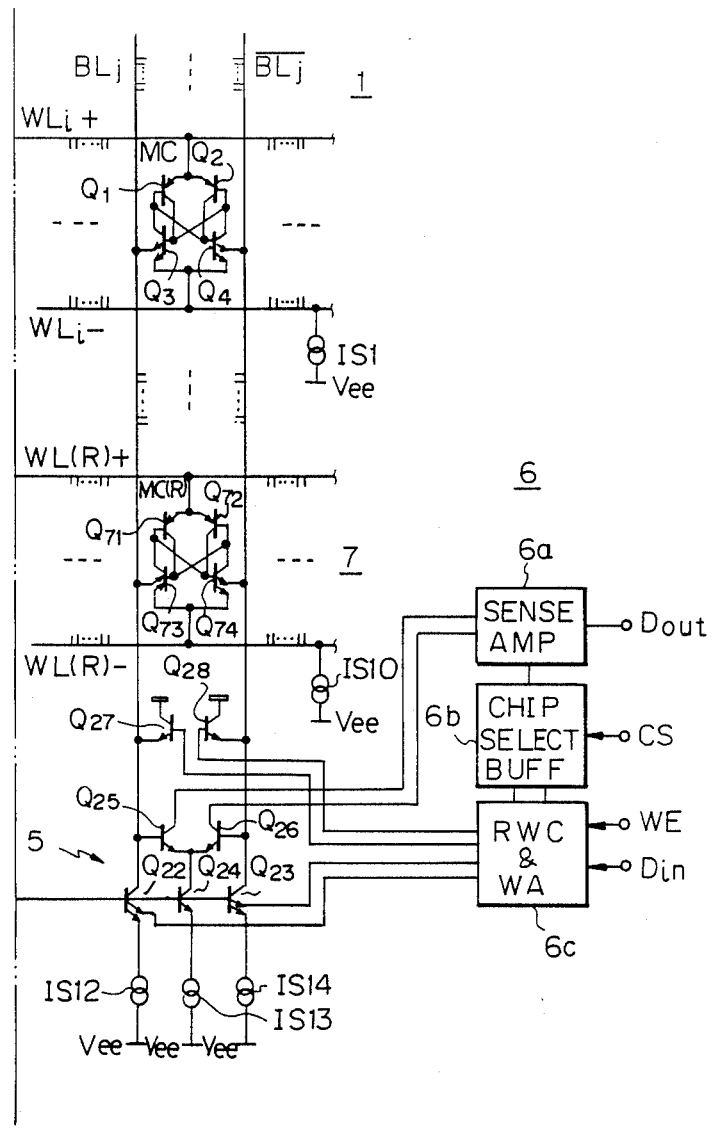

FIG. 4, which includes FIGS. 4A and 4B, is a circuit diagram of another embodiment of the ECL type RAM device corresponding to the circuit shown in FIG. 2. The emitter follower 2a in the word address buffer 2 in FIG. 2 is omitted. An address receiving circuit 20 having the same circuit configuration of the omitted emitter follower 2a is added at a preceding step of a word address buffer 2' including the current switch circuit 2b. The emitter follower 10a in the compare gate circuit 10 shown in FIG. 2 is also omitted. The bases of the transistors $Q_{13}$ and $Q_9$ are connected to a cathode of the diode $D_1$ in the address receiving circuit 20, i.e., the emitter follower. In FIG. 2, the emitter follower 2a is identical to the emitter follower 10a. Thus, the latter can be omitted, simplifying the compare gate circuit 10, as shown by a compare gate circuit 10'. The circuit operation is similar to that mentioned above, and thus, is not explained.

A plurality of redundancy configurations, each having the compare gate circuit 10 or 10', the redundancy word address driver 8, and the redundancy memory cell array 7, may be provided.

A redundancy configuration for bit lines may be provided instead of the redundancy configuration for word lines mentioned above.

Many widely different embodiments of the present invention may be constructed without departing from the spirit and scope of the present invention. It should be understood that the present invention is not limited to the specific embodiments described in this specification, except as defined in the appended claims.

We claim:

1. An emitter-coupled-logic type random access memory device comprising:
   a memory cell array including a plurality of memory cells and a plurality of address lines, each of said memory cells formed by an emitter-coupled-logic (ECL) flip-flop;
   a redundancy memory cell array including a plurality of memory cells and a plurality of redundancy address lines, each of said memory cells formed by an ECL flip-flop;
   address signal input terminals for receiving address signals;
   means, connected to said address signal input terminals, for receiving said address signals and including first ECL gate circuits outputting signals, each having:
      a first transistor having a base for receiving a bit of said address signals and having an emitter;
      a second transistor having an emitter coupled to said emitter of said first transistor; and
      first amplifying transistors for receiving the output signals from said first ECL gate circuits and amplifying the output signals;
   means, operatively connected to said address signal receiving means, and including second ECL gate circuits, each having:
      a plurality of third transistors connected to receive the output signals from said first amplifying transistors and having an emitter;
      a fourth transistor having an emitter coupled to said emitters of said third transistors; and
      drive transistors, connected to said address lines for driving said address lines in response to output signals from said second ECL gate circuits, for selecting a memory cell in said memory cell array in response to said address signals from said address signal receiving means;
   means for storing one or more defective memory address signals of one or more defective memory cells in said memory cell array;
   means, operatively connected to said defective memory address storing means and including third ECL gate circuits, each having:
      a fifth transistor having a base connected to receive said address signals;
      a sixth transistor for receiving said defective memory address signals and comparing said address signals and said defective memory address signals; and
      second amplifying transistor circuits connected to said fifth and sixth transistors, respectively, each having two amplifying transistors having emitters connected at a common node and having bases for receiving output signals from said fifth and sixth transistors, respectively, and amplifying the same, for receiving said address signals independently of said address signal receiving means and for receiving one or more defective memory address signals from said defective address storing means and comparing said address signals with said defective memory address signals; and
   means, operatively connected to said address signal receiving and comparing means and including fourth ECL gate circuits, each having:
      a second transistor having a base connected to said node of said two amplifying transistors in said second amplifying transistor circuits for receiving a signal therefrom and having an emitter;
      an eighth transistor having an emitter coupled to said emitter of said seventh transistor; and
      redundancy drive transistors, connected to said redundancy address lines, for driving respective redundancy address lines in response to output signals from said fourth ECL gate circuits, for selecting one of said memory cells in said redundancy memory cell array corresponding to one of said defective memory cells in said memory cell array,
   said memory cell selecting means, operatively connected to said node of said two amplifying transistors, being energized when said address signal does not coincide with said defective memory address signal, said redundancy memory cell selecting means not being energized when said address signal coincides with said defective memory address signal.

2. An emitter-coupled-logic type random access memory device comprising:
   a memory cell array including a plurality of memory cells and a plurality of address lines, each of said memory cells formed by an emitter-coupled-logic (ECL) flip-flop;

a redundancy memory cell array including a plurality of memory cells and a plurality of redundancy address lines, each of said memory cells formed by an ECL flip-flop;

address signal input terminals coupled to receive address signals;

an emitter follower circuit, connected to said address signal input terminals, for receiving and level-shifting said address signals;

receiving means, connected to said emitter follower circuit, for receiving said level-shifted address signals from said emitter follower circuit and including first ECL gate circuits, each having:
- a first transistor having an emitter and having a base for receiving a bit of said address signals and outputting signals;
- a second transistor having an emitter coupled to said emitter of said first transistor; and
- first amplifying transistors for amplifying output signals from said first ECL gate circuits and outputting the amplified signals;

selecting means, operatively connected to said receiving means, for selecting a memory cell in said memory cell array in response to said amplified address signals from said receiving means, and including second ECL gate circuits, each having:
- a plurality of third transistors, connected to said first amplifying transistors, for receiving the amplified output signals from said first amplifying transistors and having an emitter;
- a fourth transistor having an emitter coupled to said emitters of said third transistors; and
- drive transistors, connected to said second ECL gate circuits, for driving said address lines in response to output signals from said second ECL gate circuits;

storing means, connected to said memory cell array, for storing one or more defective memory address signals of one or more defective memory cells in said memory cell array;

means, operatively connected to said defective memory address storing means, and including third ECL gate circuits, each having:
- a fifth transistor, connected to said emitter follower circuit, having a base for receiving said level-shifted address signals from said emitter follower circuit;
- a sixth transistor, connected to said storing means, for receiving said defective memory address signals and comparing said address signals and said defective memory address signals; and
- second amplifying transistor circuits each having two amplifying transistors having emitters connected together at a node and having bases connected to said fifth and sixth transistors, respectively, for receiving output signals from said fifth and sixth transistors and amplifying said signals, for receiving said level-shifted address signals independently of said receiving means, and for receiving one or more defective memory address signals from said defective address storing means and comparing said address signals with said defective memory address signals; and means, operatively connected to said address signal receiving and comparing means, and including fourth ECL gate circuits providing output signals, each having:
- a seventh transistor, having a base connected to said node of said two amplifying transistors and having an emitter;
- an eighth transistor having an emitter coupled to said emitter of said seventh transistor; and
- redundancy drive transistors, connected to said fourth ECL gate circuit, each driving corresponding redundancy address lines in response to the output signals from said fourth ECL gate circuits, for selecting one of said memory cells in said redundancy memory cell array corresponding to one of said defective memory cells in said memory cell array, said memory cell selecting means, operatively connected to said node of said two amplifying transistors, being energized when said address signal does not coincide with said defective memory address signal, and not being energized when said address signal coincides with said defective memory address signal.

3. An emitter-coupled-logic type random access memory device comprising:

a memory cell array including a plurality of memory cells and a plurality of address lines, each of said memory cells formed by an emitter-coupled-logic (ECL) flip-flop;

a redundancy memory cell array including a plurality of memory cells and a plurality of redundancy address lines, each of said memory cells formed by an ECL flip-flop;

address signal input terminals connected to receive address signals;

a first emitter follower circuit, connected to said address signal input terminals, for receiving and level-shifting said address signals to provide first level-shifted address signals;

a second emitter follower circuit, connected to said address signal input terminals, for receiving and level-shifting said address signals to provide second level-shifted address signals;

receiving means connected to said first emitter follower circuit, for receiving said first level-shifted address signals and formed by ECL circuits in said first emitter follower circuit and including first ECL gate circuits outputting signals, each having:
- a first transistor having a base for receiving a bit of said address signals and having an emitter;
- a second transistor having an emitter coupled to said emitter of said first transistor; and
- first amplifying transistors, connected to said first ECL gate circuits, amplifying output signals from said first ECL gate circuits;

select means, operatively connected to said receiving means, for selecting a memory cell in said memory cell array in response to said address signals from said receiving means, and including second ECL gate circuits, each having:
- a plurality of third transistors, connected to said first amplifying transistors, for receiving output signals from said first amplifying transistors and having an emitter;
- a fourth transistor having an emitter coupled to said emitter of said third transistors; and
- drive transistors, connected to said second ECL gate circuits, for driving said address lines in response to output signals from said second ECL gate circuits;

storing means, connected to said memory cell array, for storing one or more defective memory address signals of one or more defective memory cells in said memory cell array;

means, operatively connected to said storing means, and including third ECL gate circuits, each having:
- a fifth transistor, connected to said second emitter follower circuit, having a base for receiving said second level-shifted address signals from said second emitter follower circuit;
- a sixth transistor, connected to receive said defective memory address signals, and comparing said address signals and said defective memory address signals; and
- second amplifying transistor circuits each having two amplifying transistors having emitters connected at a node and having bases connected to said fifth and sixth transistors, respectively, for receiving output signals from said fifth and sixth transistors and amplifying said output signals, for receiving said second level-shifted address signals independently of said receiving means and for receiving one or more defective memory address signals from said defective address storing means and comparing and said address signals with said defective memory address signals; and means, operatively connected to said receiving and comparing means and including fourth ECL gate circuits, each having:
- a seventh transistor having a base connected to said node connecting said two amplifying transistors for receiving a signal at said node, and having an emitter;
- a eighth transistor having an emitter coupled to said emitter of said seventh transistor; and
- redundancy drive transistors connected to said redundancy address lines and said fourth ECL gate circuits, each redundancy drive transistor driving corresponding redundancy address lines in response to output signals from said fourth ECL gate circuits, and for selecting one of said memory cells in said redundancy memory cell array corresponding to one of said defective memory cells in said memory cell array;

said selecting means operatively connected to said node of said two amplifying transistors and being energized when said address signal does not coincide with said defective memory address signal, and not being energized when said address signal coincides with said defective memory address signal.

* * * * *